(12) United States Patent
Miyano et al.

(10) Patent No.: US 6,297,074 B1
(45) Date of Patent: Oct. 2, 2001

(54) FILM CARRIER TAPE AND LAMINATED MULTI-CHIP SEMICONDUCTOR DEVICE INCORPORATING THE SAME AND METHOD THEREOF

(75) Inventors: Ichiro Miyano; Koji Serizawa, both of Fujisawa; Hiroyuki Tanaka; Tadao Shinoda, both of Yokohama; Suguru Sakaguchi, Chigasaki, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 08/464,577

(22) Filed: Jun. 5, 1995

Related U.S. Application Data

(62) Division of application No. 07/727,050, filed on Jul. 9, 1991, now Pat. No. 5,631,497.

(30) Foreign Application Priority Data

Nov. 7, 1990 (JP) ................................................ 2-181416

(51) Int. Cl.⁷ ............................ H01L 21/44; H01L 21/48; H01L 21/50
(52) U.S. Cl. ...................... 438/109; 438/111; 438/122; 438/123
(58) Field of Search ..................................... 437/206, 208, 437/217, 220, 902, 915; 257/686, 706, 707; 438/109, 111, 122, 123

(56) References Cited

U.S. PATENT DOCUMENTS

| | | | |
|---|---|---|---|
| 3,611,061 | * 10/1971 | Segerson | 437/220 |
| 3,874,072 | * 4/1975 | Rose et al. | 437/183 |
| 3,967,366 | 7/1976 | Birglechner et al. | |
| 4,132,856 | * 1/1979 | Hutchison et al. | 174/52 FP |
| 4,315,845 | * 2/1982 | Tanahashi et al. | 260/42.28 |
| 4,331,831 | * 5/1982 | Ingram et al. | 174/52 FP |
| 4,635,092 | * 1/1987 | Yerman et al. | 428/571 |
| 4,680,613 | * 7/1987 | Daniels et al. | 257/675 |
| 4,716,124 | 12/1987 | Yerman et al. | |

(List continued on next page.)

FOREIGN PATENT DOCUMENTS

| | | |
|---|---|---|
| 2747393 | * 4/1978 | (DE) . |
| 86724 | * 8/1983 | (EP) . |
| 5382168 | * 7/1978 | (JP) . |
| 59205747 | * 11/1984 | (JP) . |
| 6043849 | * 3/1985 | (JP) . |
| 60138944 | * 7/1985 | (JP) . |
| 60138945 | * 7/1985 | (JP) . |
| 60148153 | * 8/1985 | (JP) . |
| 6153752 | * 3/1986 | (JP) . |
| 6180842 | * 4/1986 | (JP) . |
| 63-36052 | 3/1988 | (JP) . |
| 2138761 | * 5/1990 | (JP) . |
| 2198148 | * 8/1990 | (JP) . |
| 2264458 | * 8/1990 | (JP) . |

OTHER PUBLICATIONS

Microelectronics Packaging Handbook; New York, Van Nostrand Reinhold. pp. 411–413. TK7874.6824, 1988.*

*Primary Examiner*—David E. Graybill
(74) *Attorney, Agent, or Firm*—Antonelli, Terry, Stout & Kraus, LLP

(57) ABSTRACT

A film carrier tape and laminated multi-chip semiconductor device incorporating the same and method thereof wherein a plurality of chip semiconductor devices are laminated onto a substrate. Each chip semiconductor device includes a film carrier tape having leads, a semiconductor chip electrically connected to the leads, a heat sink mounted to a surface of the chip, and a connector for mounting the heat sink, the connector being electrically connected to the leads of the film carrier tape. The film carrier tape includes a carrier member having a metallic layer superposed thereon which is etched so as to form the leads and the heat sink.

24 Claims, 16 Drawing Sheets

U.S. PATENT DOCUMENTS

| | | | |
|---|---|---|---|
| 4,809,053 | * | 2/1989 | Kuraishi ................................. 357/70 |
| 4,916,506 | * | 4/1990 | Gagnon ................................. 257/675 |
| 4,947,237 | * | 8/1990 | Fusaroli ................................. 257/675 |
| 4,954,878 | | 9/1990 | Fox et al. . |
| 5,023,202 | | 6/1991 | Long et al. . |
| 5,047,837 | * | 9/1991 | Kitano et al. ........................ 364/388 |
| 5,068,712 | * | 11/1991 | Murakami et al. ................... 357/72 |
| 5,073,521 | | 12/1991 | Braden . |
| 5,114,880 | | 5/1992 | Lin . |
| 5,134,546 | * | 7/1992 | Izumi et al. ........................ 361/395 |
| 5,138,438 | * | 8/1992 | Masayuki et al. ..................... 357/75 |
| 5,146,310 | * | 9/1992 | Bayan et al. ........................ 257/675 |
| 5,198,888 | * | 3/1993 | Sugano et al. ....................... 257/686 |
| 5,200,806 | * | 4/1993 | Sawaya ................................ 257/676 |
| 5,266,834 | * | 11/1993 | Nishi et al. .......................... 257/706 |
| 5,299,091 | * | 3/1994 | Hoshi et al. ......................... 361/723 |

\* cited by examiner

FILM CARRIER TAPE AND LAMINATED MULTI-CHIP SEMICONDUCTOR DEVICE INCORPORATING THE SAME AND METHOD THEREOF

This application is a Division of application Ser. No. 07/727,050, filed Jul. 9,1991 U.S. Pat. No. 5,631,497.

BACKGROUND OF THE INVENTION

The present invention relates to a method and apparatus for cooling a laminated multi-chip semiconductor device through a connector which laminated semiconductor device includes film carrier (hereinafter referred to simply as TAB: Tape Automated Bonding) type semiconductor devices wherein a semiconductor chip is connected electrically to a film carrier tape.

A conventional multi-chip semiconductor device cooling method is disclosed in Japanese Utility Model Laid Open No. 36052/88 wherein the cooling is effected through radiation fins attached to semiconductor chips arranged planarly on a substrate. Further, as a cooling method for a packaging structure of an overlay arrangement in an SOP (Small Outline Package), reference is made to Japanese Utility Model Laid Open No. 261166/87.

According to the above conventional techniques it has been easy to mount radiation fins directly onto a semiconductor chip. In a laminated multi-chip semiconductor device according to the TAB method, however, it is only the top or the bottom layer that permits the mounting of radiation fins. Its structure does not permit the mounting of radiation fins to intermediate layers. Therefore, no consideration is given to direct cooling of such intermediate layers. Consequently, in the case of using semiconductor chips which generate a large quantity of heat during operation, or when plural layers are operated at a time, there occurs malfunction or deterioration of the semiconductor chips due to overheating. Also, there has been a problem of deteriorated reliability of connecting portions caused by thermal fatigue.

SUMMARY OF THE INVENTION

It is therefore an object of the present invention to provide a method and apparatus for mitigating the influence of heat between the above intermediate layers of a laminated multi-layer semiconductor device and then effecting cooling of such intermediate layers positively.

It is another object of the present invention to provide a film carrier tape for a semiconductor device with a heat sink for enabling cooling of a semiconductor chip.

According to a feature of the present invention, at least a heat sink and/or a radiation fin is provided on each semiconductor chip and connector.

In accordance with the present invention, a heat sink can be formed onto each semiconductor chip without greatly changing the conventional manufacturing process for TAB type semiconductor devices. The heat generated is conducted to the exterior of a laminated multi-chip semiconductor device positively by the action of a heat sink mounted on each layer of a semiconductor chip. It is then released to the open air. Particularly in intermediate layers, therefore, the cooling is ensured as compared with the case where no heat radiation structure is provided. When different kinds of semiconductor chips are laminated, the interference of heat from one to another semiconductor chip can be suppressed by providing a heat insulator on each heat sink. As a result, the application range of a laminated multi-chip semiconductor device is expanded. Further, the radiation of heat from the lead-connector electrical connection is promoted by electrical conducting parts provided on the connector in place of through holes and serving as a radiation fin. Consequently, it is possible to suppress the rise of temperature in operation, prevent malfunction caused by the deterioration of performance, and improve the reliability of connections attained by the reduction of thermal stress generated.

DESCRIPTION OF THE PREFERRED EMBODIMENTS

Figure 1:
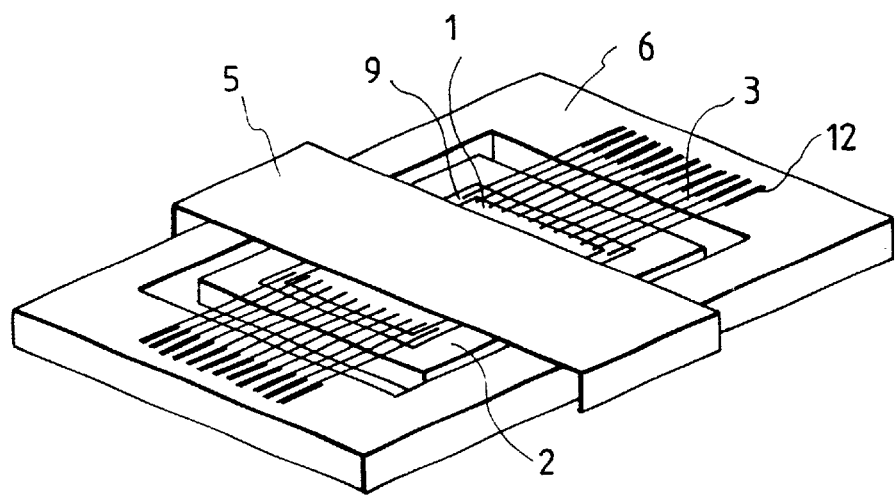
FIG. 1 illustrates a cooling structure using a TAB tape with heat sink, also serving as a package of a single layer in accordance with the present invention.
Figure 2:
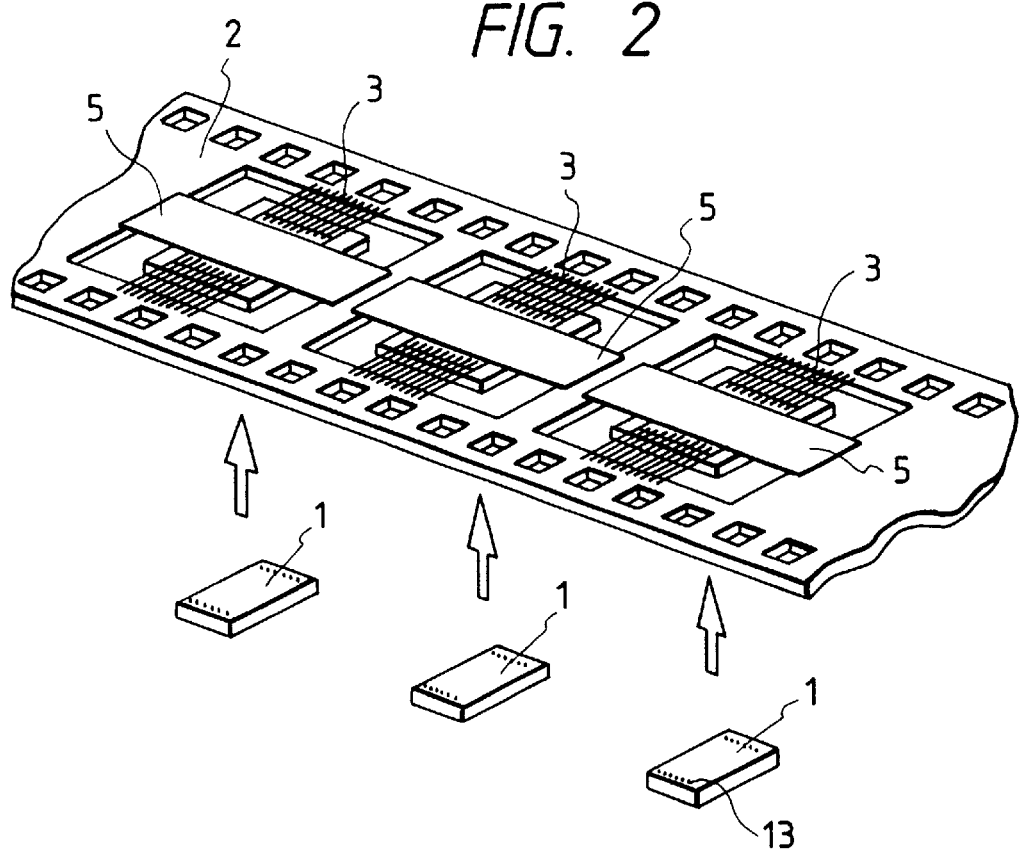
FIG. 2 illustrates fabrication of a heat sink in a TAB tape manufacturing process.

Referring now to the drawings wherein like reference numerals are utilized to designate like parts, FIG. 1 is a perspective view showing a cooling structure for a TAB type semiconductor device using a heat sink which also serves as a package. In accordance with the present invention heat sinks 5, each to be mounted on a semiconductor chip 1, are formed simultaneously in a TAB tape manufacturing process and then mounted in accordance with ILB (Inner Lead Bonding) as shown in FIG. 2.

Figure 3:
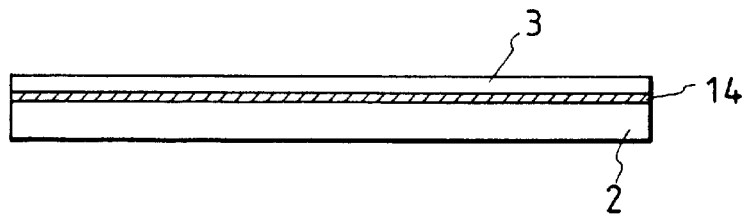
FIG. 3 illustrates a tape of a three-layer structure.

In a three-layer film carrier tape for a semiconductor device as shown in FIG. 3, which includes a tape 2 as a carrier, a copper foil layer as a lead portion 3, and an adhesive layer 14 for lamination thereof, usually a device hole and sprocket holes are formed in the tape for TAB, then the copper layer is bonded to the tape through the adhesive layers, and thereafter the copper foil is etched into the shape of leads to complete a tape carrier. At this time, in accordance with the present invention, an anti-etching treatment is applied in the shape of the lead 3 portion and also applied to the portion corresponding to the heat sink 5, whereby the heat sink 5 is formed as in FIG. 2 simultaneously with the etching of the lead portion. The shape of the heat sink is not specially limited with the only requirement being that there is no interference with the ILB portion on the chip and a sectional area which permits the transfer of heat in a quantity matching the quantity of heat generated during the operation of chip is ensured. Tension test specimens of copper foil for TAB present heretofore are of similar shapes and dimensions, so it is possible to apply that processing method utilizing the features described herein.

In the following ILB process, the inner leads 3 are bonded to lug-like electrodes called bumps 13 formed on each chip 1 using a heating tool. Thus, the semiconductor chip 1 is mounted on the TAB tape. At this time, a thermosetting resin of high thermal conductivity, e.g. a crystalline filler-incorporated epoxy resin, is applied to the surface of the semiconductor chip 1 to effect the mounting of the heat sink 5 to the chip surface at the same time.

Further, the bonding portion of the chip surface, the area surrounding the device hole, and the heat sink 5 are sealed with a potting resin 9 to complete a TAB tape reel with the heat sink. Since this manufacturing process is carried out in reeled state of the tape and the conventional technique and process are applicable almost as they are, the manufacturing process described above is suitable also for mass production.

Figure 5:
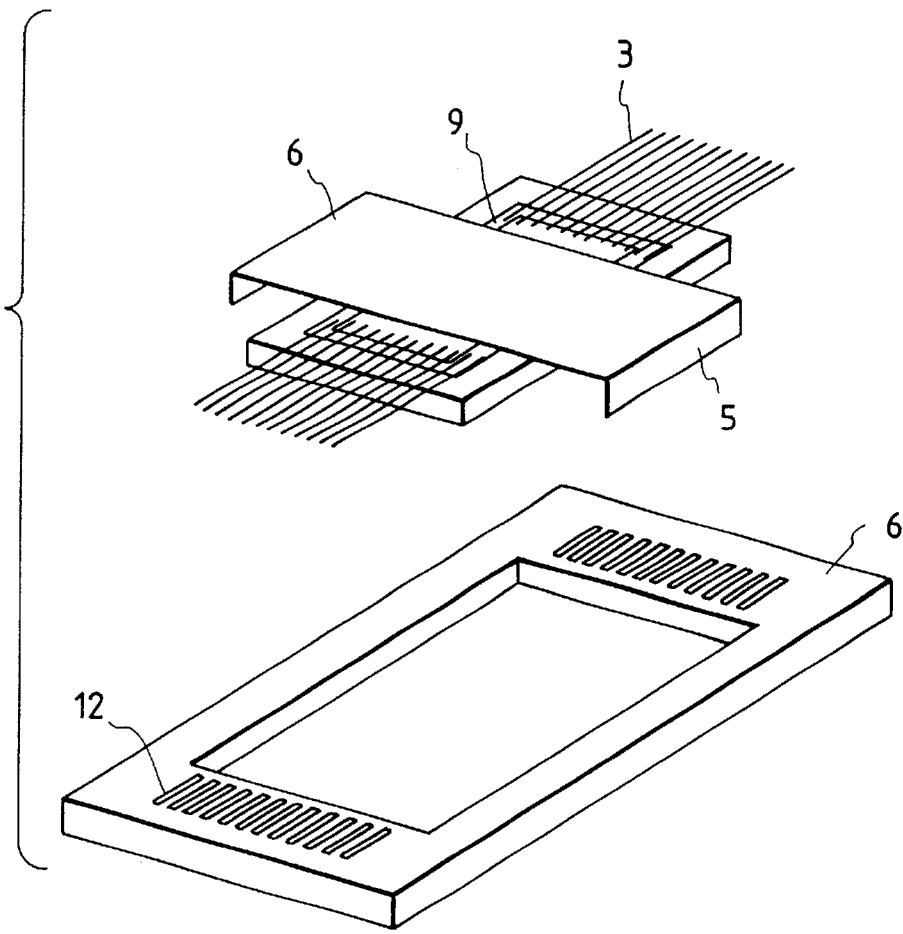
FIG. 5 illustrates a TAB tape with heat sink punched from a TAB tape reels, as well as a connector.

Further, a TAB type semiconductor chip with heat sink 5 punched from the TAB tape reel in such a shape as shown in FIG. 5 is electrically connected by soldering through the leads 3 to electrical connections 12 called patterns on a connector 6. Thereafter, the heat sink 5 is shaped in the same manner as in the leads form the SOP package to obtain the package structure shown in FIG. 1.

Figure 6:
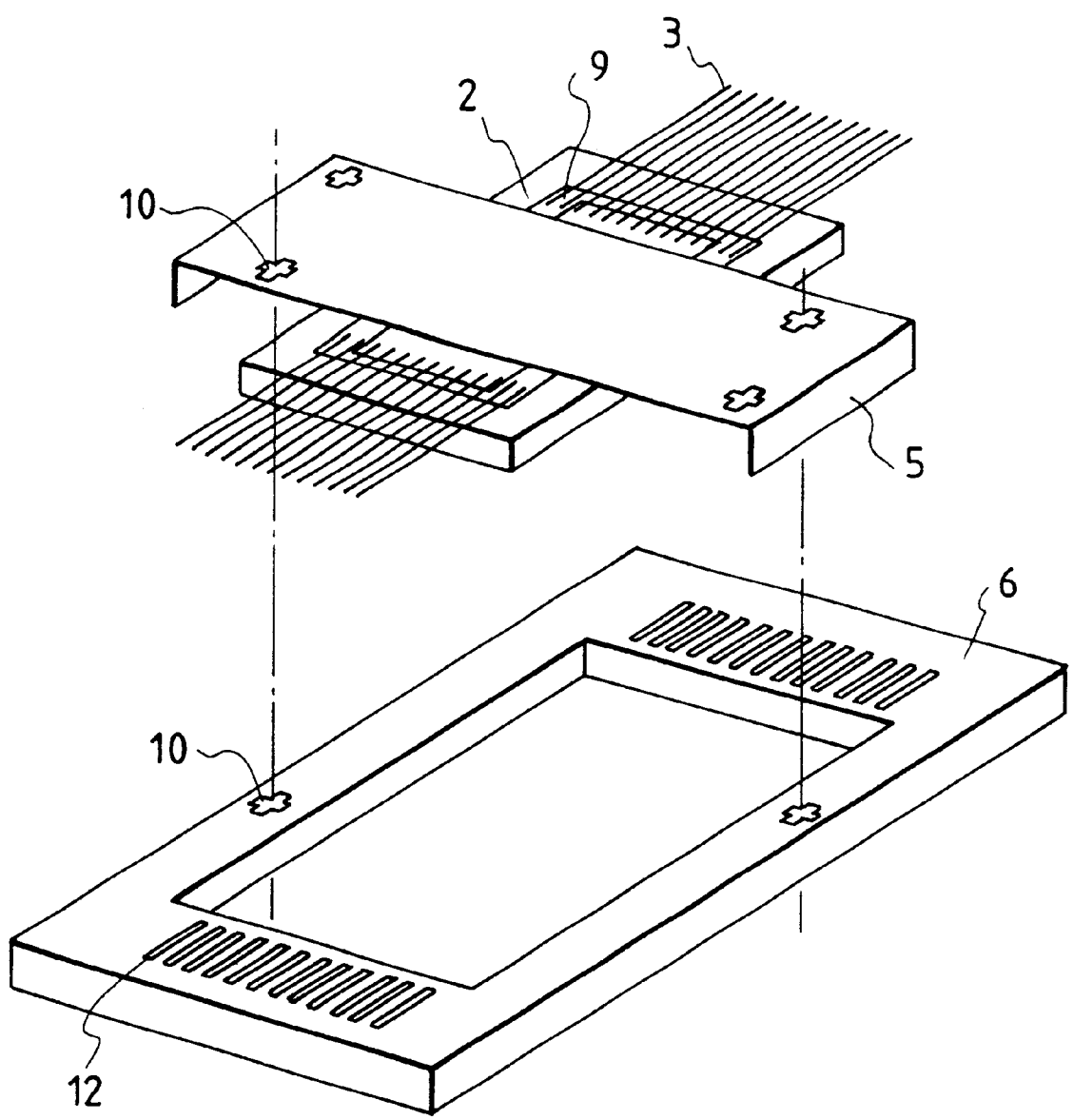
FIG. 6 illustrates connection with a connector and registration between TAB leads with the heat sink and patterns on the connector.

The heat sink 5 can be utilized for positioning the outer leads of the TAB tape with respect to the patterns on the connector 6. More specifically, such positioning marks 10 as shown in FIG. 6 are provided on the heat sink formed on the TAB tape and are brought into alignment with like positioning marks 10 provided on the connector 6 to enable registration of the outer leads and the patterns 12 with respect to each other. Since the positioning marks 10 are formed by etching or photoprinting, it is possible to obtain a dimensional accuracy sufficient for the registration of the leads 3 and the patterns 12.

Figure 4:
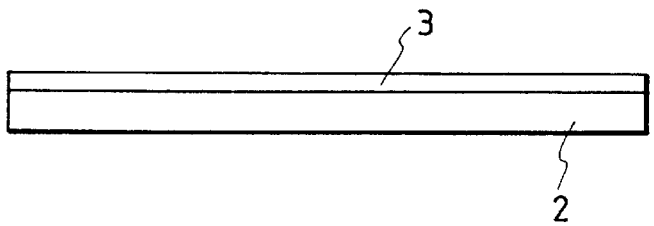
FIG. 4 illustrates a tape of a two-layer structure.

For example, even in the case of using a two-layer tape as shown in FIG. 4, wherein the shape of leads, etc. is formed on the tape carrier 2 directly by plating, a heat sink in accordance with the present invention can be formed if the thickness and strength of the copper foil are sufficient for such purpose because the copper foil can be formed into a desired shape by etching.

In the case where the semiconductor chip 1 incorporated in the above semiconductor device is a 4M DRAM, the power consumption in operation is about 500 mW and the chip, as a single chip, generates heat to the extent of about 60° C. in terms of temperature. In the case where a semiconductor chip still larger in power consumption is used, it is presumed that the temperature will reach a still higher level. Therefore, it is necessary to adopt an effective heat radiating structure. If there is used such a heat sink as shown in FIG. 1 according to the present invention, it is possible to promote the radiation of heat from the chip surface to the atmosphere effectively through the metal heat sink which has good heat conduction properties.

Figure 7:
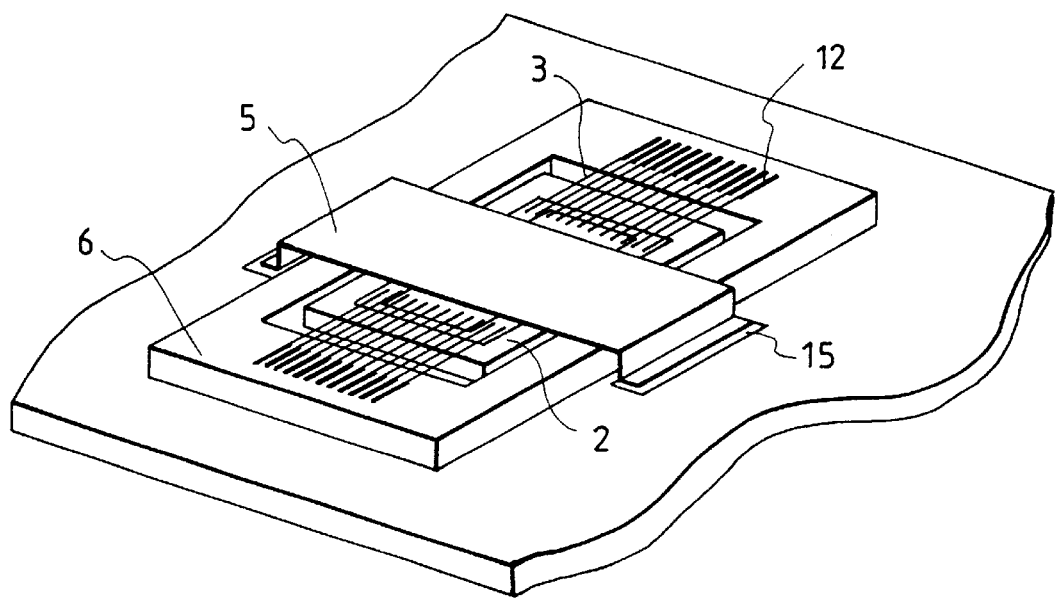
FIG. 7 illustrates a structure wherein a heat sink is connected to a substrate through a heat conducting pattern.
Figure 8:
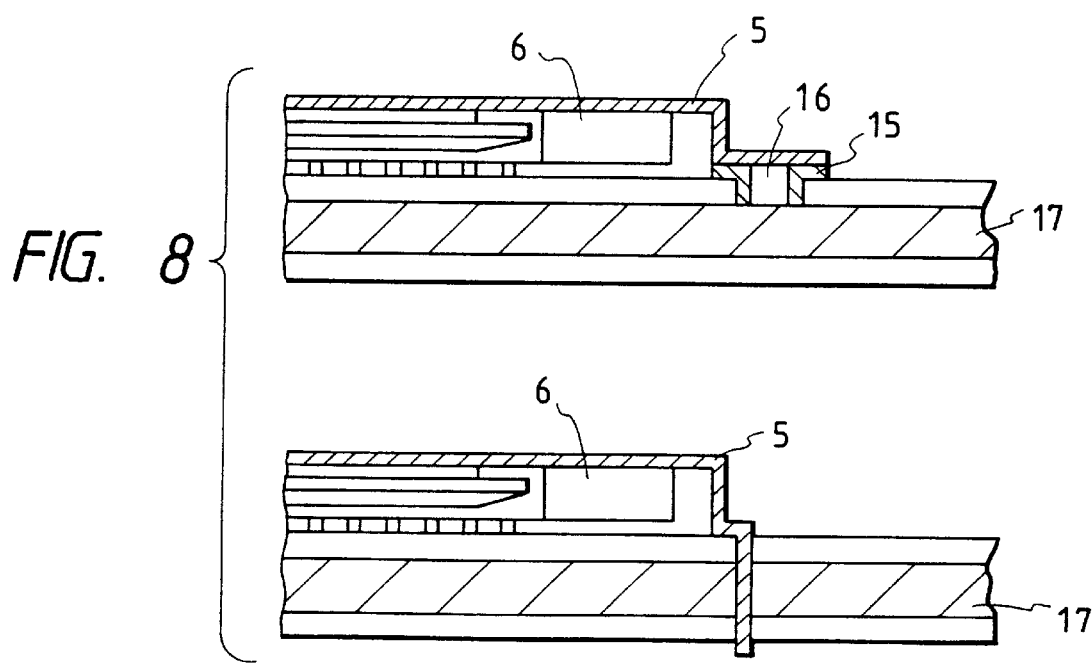
FIGS. 8 illustrate connection of an MC (metal core) substrate and the heat sink.

For promoting the conduction of heat to the substrate in the heat radiating structure including the substrate, the heat sink 5 is formed as illustrated in FIG. 7 and connected by soldering for example to a heat conducting pattern 15 formed on the substrate. In this case, if an MC (metal core) substrate 17 which is superior in thermal conductivity is used as the substrate as shown in FIGS. 8(a) and 8(b), the conduction of heat is performed throughout the entire substrate. Thus, the release of heat to the atmosphere can be achieved by effectively using the area of the substrate in addition to the area proper to the semiconductor device, so that the heat radiation effect is further improved. If the heat conducting pattern 15 is connected to the interior metal directly through a through hole 16, as shown in FIG. 8(a) or if the heat sink 5 has ends thereof extending into or through the metal core substrate 17 as shown in FIG. 8(b), there can be attained a more outstanding effect.

Figure 14:
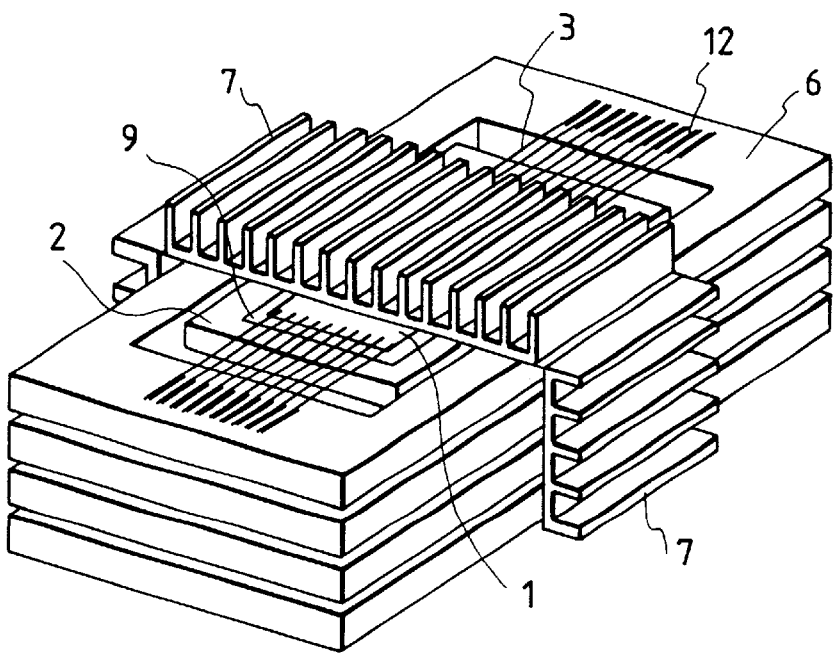
FIG. 14 illustrates a cooling structure including the cooling structure of FIG. 12 with heat radiation fins.

Further, as shown in FIG. 14, by attaching radiation fins 7 to the outside of the heat sink, the heat radiation area can be increased and the effect of heat radiation to the atmosphere can be enhanced.

Figure 9:
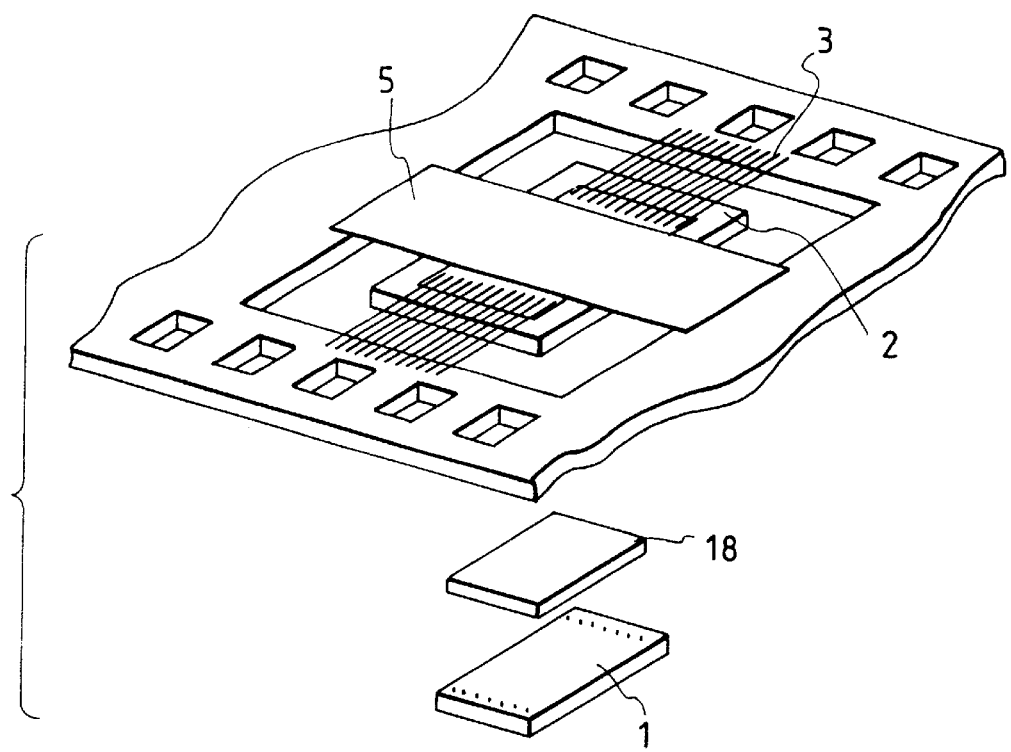
FIG. 9 illustrates connection of a heat sink and a semiconductor chip using an adhesive sheet.
Figure 10:
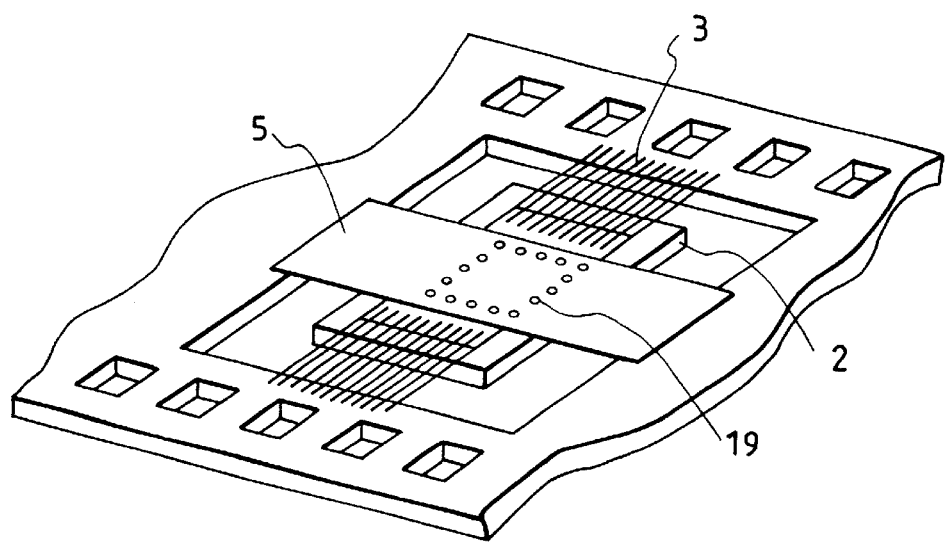
FIG. 10 illustrates connection of a heat sink and a semiconductor chip using dummy bumps.

In ILB, the thermosetting resin used for the purpose of close contact between the heat sink 5 and the semiconductor chip 1 on the tape carrier 2 may be substituted by, for example, an extremely thin film-like thermosetting adhesive 18 as shown in FIG. 9, or silver paste. Or the heat sink 5 may be bonded to a semiconductor chip through dummy bumps 19 arranged on the chip as shown in FIG. 10, which dummy pumps having nothing to do with an electrical connection.

Figure 11A:
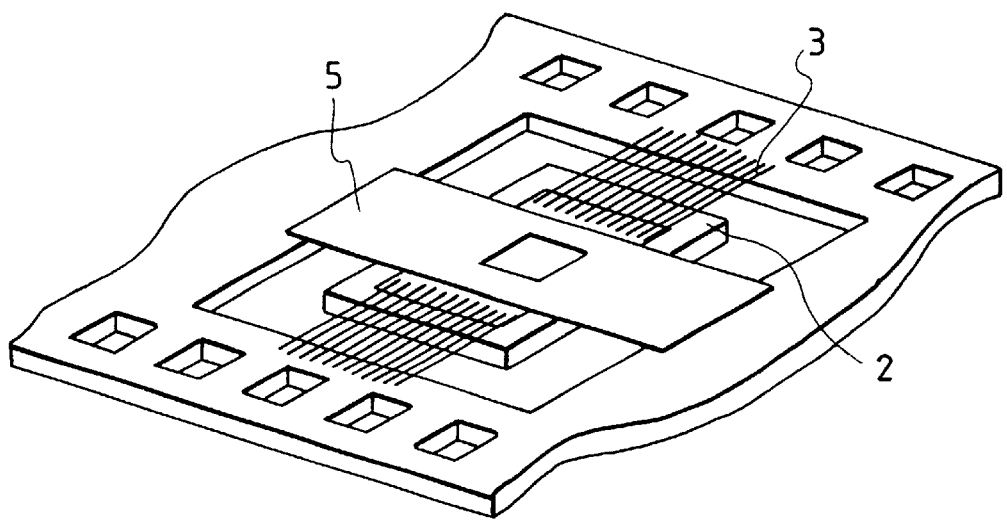
FIGS. 11(a) and 11(b) each illustrate a heat sink formed with a hole for improving compatibility with a potting resin.
Figure 11B:
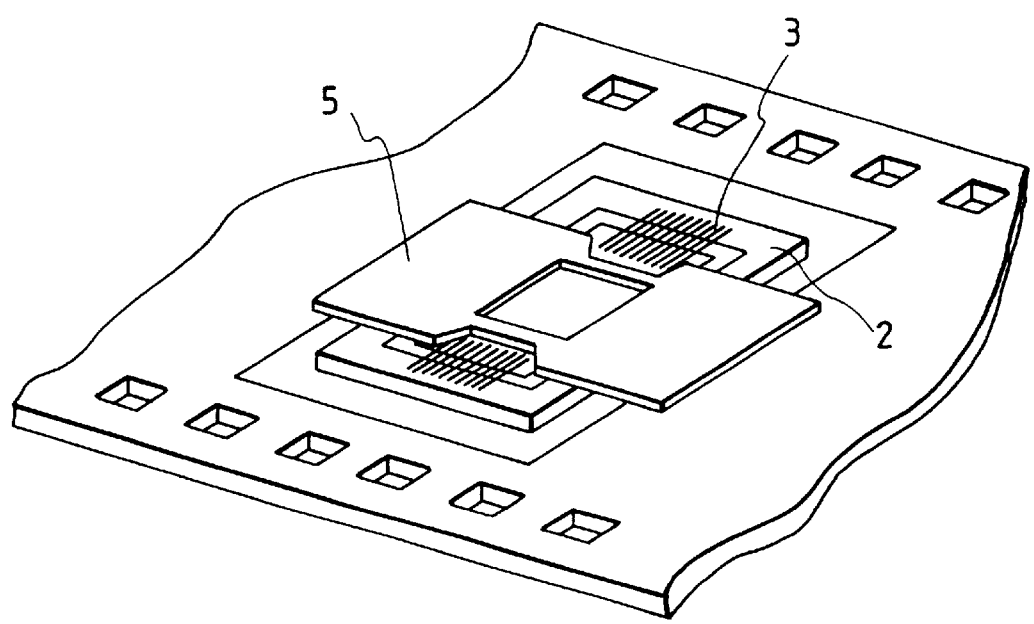

A hole may be formed in the heat sink as shown in FIGS. 11(a) and 11(b) for the purpose of improving the adhesion between the potting resin 9, the chip 1 and heat sink 5, thereby preventing the inclusion of air bubbles in the heat sink portion which overlies the chip. This hole is not specially limited to the configuration shown with the hole being formed in a position where there is no interference with the ILB portion so as to ensure a sectional area which permits a satisfactory conduction of the heat from the chip.

Figure 12:
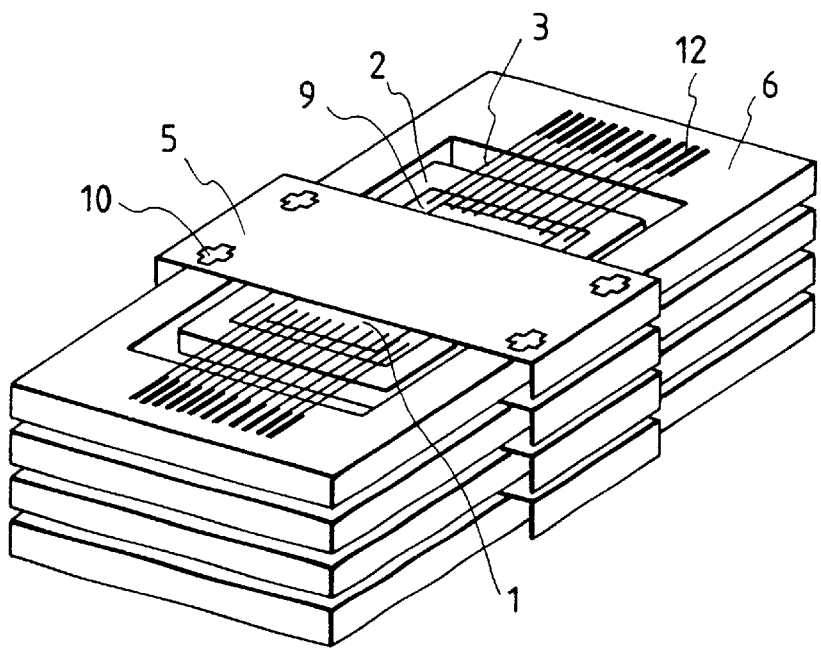
FIG. 12 illustrates a cooling structure in a laminated multi-chip semiconductor device.

FIG. 12 is a perspective view showing a cooling structure for the entirety of a laminated multi-chip semiconductor device and has a heat radiation structure which is obtained in the following manner. TAB type semiconductor chips each having the heat sink 5 as previously described are electrically connected together by soldering in a sandwiched fashion to form a four-layer laminate, using connectors 6 whose upper and lower surfaces are electrically connected to each other.

For example, when the semiconductor chips incorporated in the laminated multi-chip semiconductor device are 4M DRAM chips and are all operated at a time, the temperature of the heat generated reaches as high as 150° C. or so, much higher than the maximum working temperature of each semiconductor chip which is considered to be 60° C. or so. In the case where the chip of the second or the third layer sandwiched vertically in between the other semiconductor chips as in FIG. 12 operates, if the device does not have a heat radiation structure, it is impossible to effect the radiation of heat directly from the semiconductor chip into the atmosphere or to the substrate, so the maximum temperature becomes higher by at least 5° C. in comparison with the case where the top or the bottom chip operates. This temperature difference will be more conspicuous when operations are concentrated on the chips of intermediate layers or when a logical operation circuit component which consumes a large amount of electric power and which generates a large quantity of heat is incorporated in the device.

Figure 13:
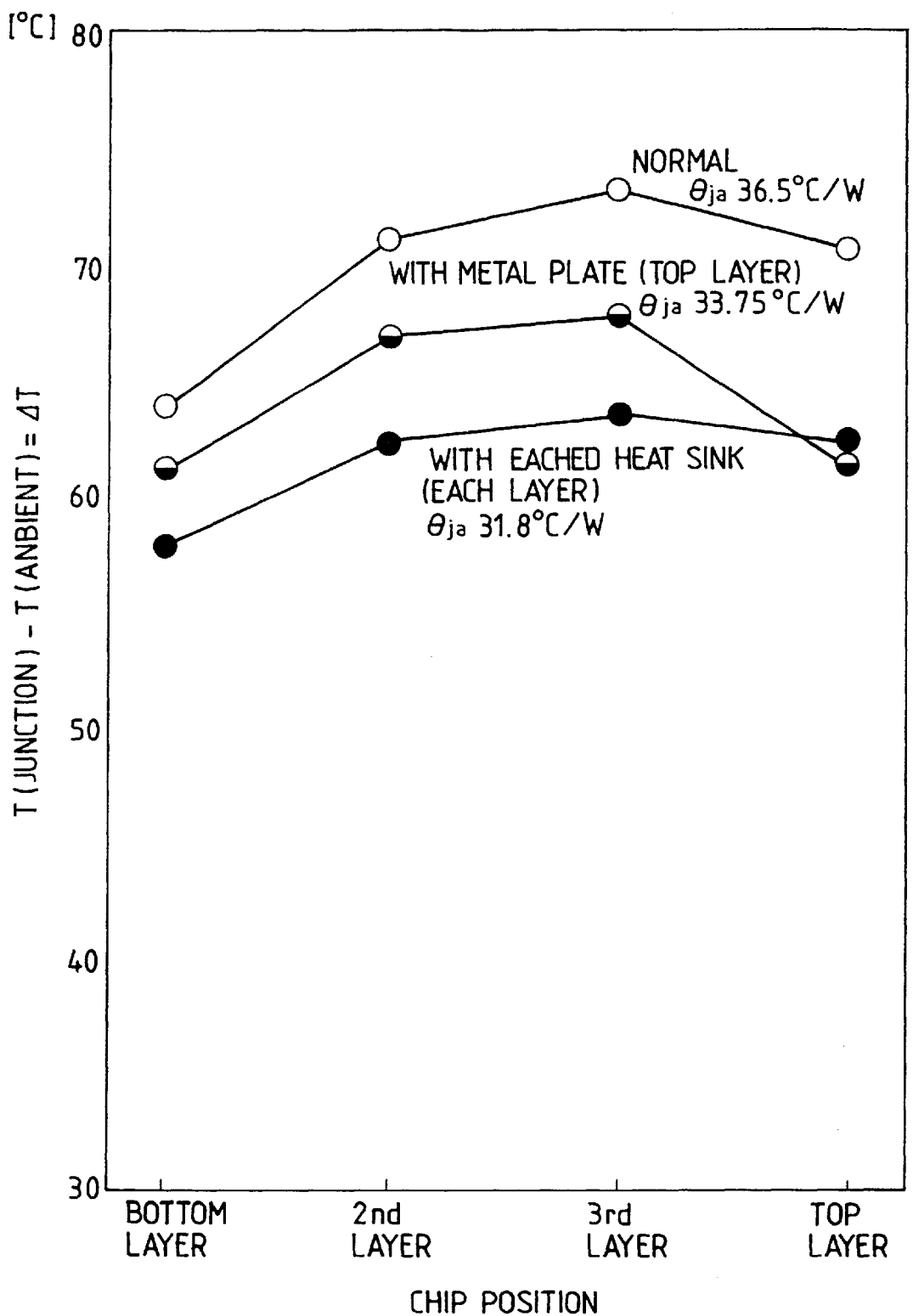
FIG. 13 illustrates curves showing temperature effects of the present invention and prior art constructions.

FIG. 13 shows curves showing the temperature effects for a four-layer laminated semiconductor chip structure in accordance with the present invention having a heat sink 5 for each layer represented by curve A, in comparison with a similar four-layer structure of a prior art construction having a metal plate only on the top layer represented by curve B and a similar four-layer structure of a prior art construction having no metal plate represented by curve C. The temperature points are plotted for the structure in operation and as is evident the heat sink arrangement of the present invention (curve A) provides an overall improvement in reduction of heating and operation with θja of 31.8° C./W and curve C has θja of 36.5° C./W. Curve C represents measured values where curves A and B represent calculated values for the construction indicated.

By using the heat sink 5 according to the present invention, the heat generated can be released directly from the chip surfaces of intermediate layers to the exterior much more efficiently through a metal of good thermal conductivity, in addition to the conventional heat radiation without using such heat sink in which the heat generated is transferred successively from one to another semiconductor chip through a layer of air, then released to the atmosphere from the top layer and also from the bottom layer through the substrate. Consequently, the cooling efficiency for the entire device can be enhanced. In this case, the surface area can be increased and the effect of heat radiation enhanced by attaching radiation fins 7 to the outside of the heat sink 5 in such a manner as shown in FIG. 14.

Figure 15A:
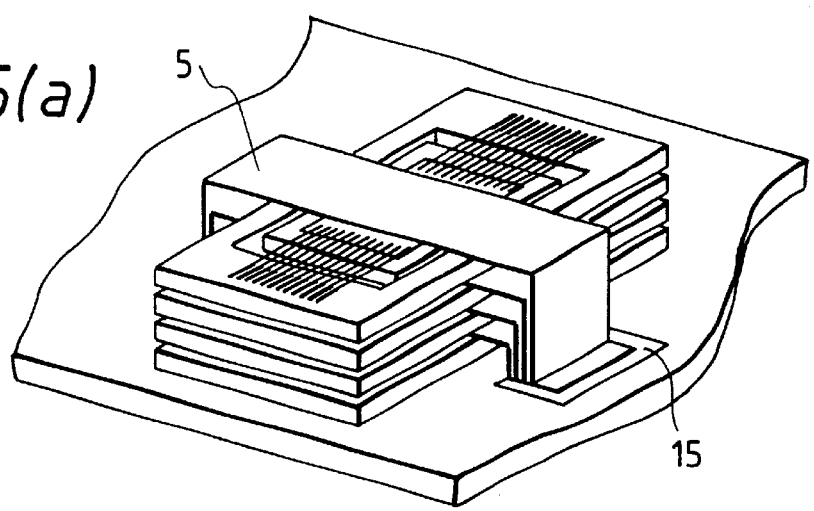
FIGS. 15(a) and 15(b) illustrate heat sinks in a laminated multi-chip semiconductor device connected to a substrate through a heat conducting pattern.
Figure 15B:
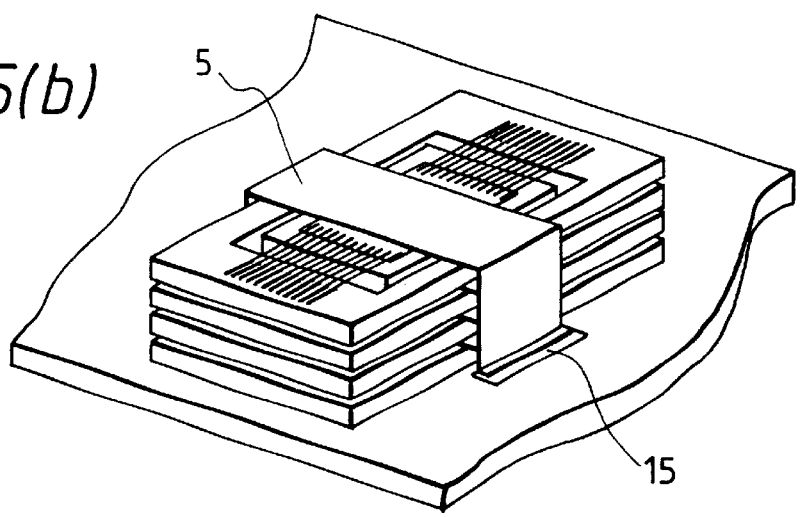

The heat sink portion may be formed as in FIGS. 15(a) and 15(b) and then soldered to the substrate. According to this construction, the heat conduction to the substrate is promoted and not only the surface area proper to the laminated multi-chip semiconductor device but also the surface area of the packaging substrate can be utilized for the release of heat to the atmosphere. That is, the effect of heat radiation can be further enhanced with the construction. The effect of heat radiation can be still further enhanced if an MC (metal core) substrate is used as the packaging substrate like that shown in FIG. 8(a) and 8(b) and if the heat sink is directly connected to the interior metal through a through hole, for example.

Figure 16:
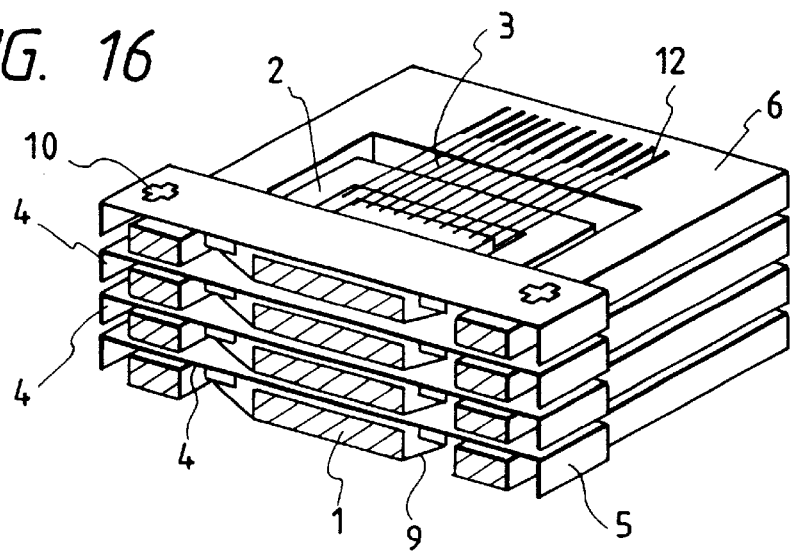
FIG. 16 is a sectional perspective view of a laminated multi-chip semiconductor device using a heat sink provided with a heat insulator.

FIG. 16 illustrates a laminated multi-chip semiconductor device wherein different kinds of semiconductor chips markedly different in the quantity of heat generated and in the working temperature range are laminated together and a heat insulator 4, e.g. silica aerogel (thermal conductivity; 0.024 W/mK), is mounted to the heat sinks 5 in the positions illustrated. In the case where the semiconductor chip layers are greatly different in the quantity of heat generated and when the laminated multi-chip semiconductor device operates and generates heat, if the heat insulator 4 is not present, the generated heat will be conducted from a semiconductor chip of a high temperature to a semiconductor chip of a lower temperature, resulting in that the semiconductor chip of a lower temperature is heated, causing malfunction, although the device as a whole is cooled by the heat sinks 5. On the other hand, although the semiconductor chip of a high temperature is cooled to some extent, the influence of malfunction on the laminated multi-chip semiconductor device is much greater and not negligible. The heat insulator 4 permits reduction of the heat transfer between the heat generating chip surface and the chip surface of another layer, thereby suppressing the heating of the latter chip surface by the former chip surface, whereby it becomes possible to constitute laminated multi-chip semiconductor devices of various combinations without impairing the characteristics of each semiconductor chip. The heat insulator 4 can be mounted efficiently by selective mounting thereof between semiconductor chips causing a temperature difference. The heat insulator 4 is therefore mounted on top and bottom portions of the heat sink 5 at positions other than in contact with the semiconductor chip, where appropriate.

Figure 17:
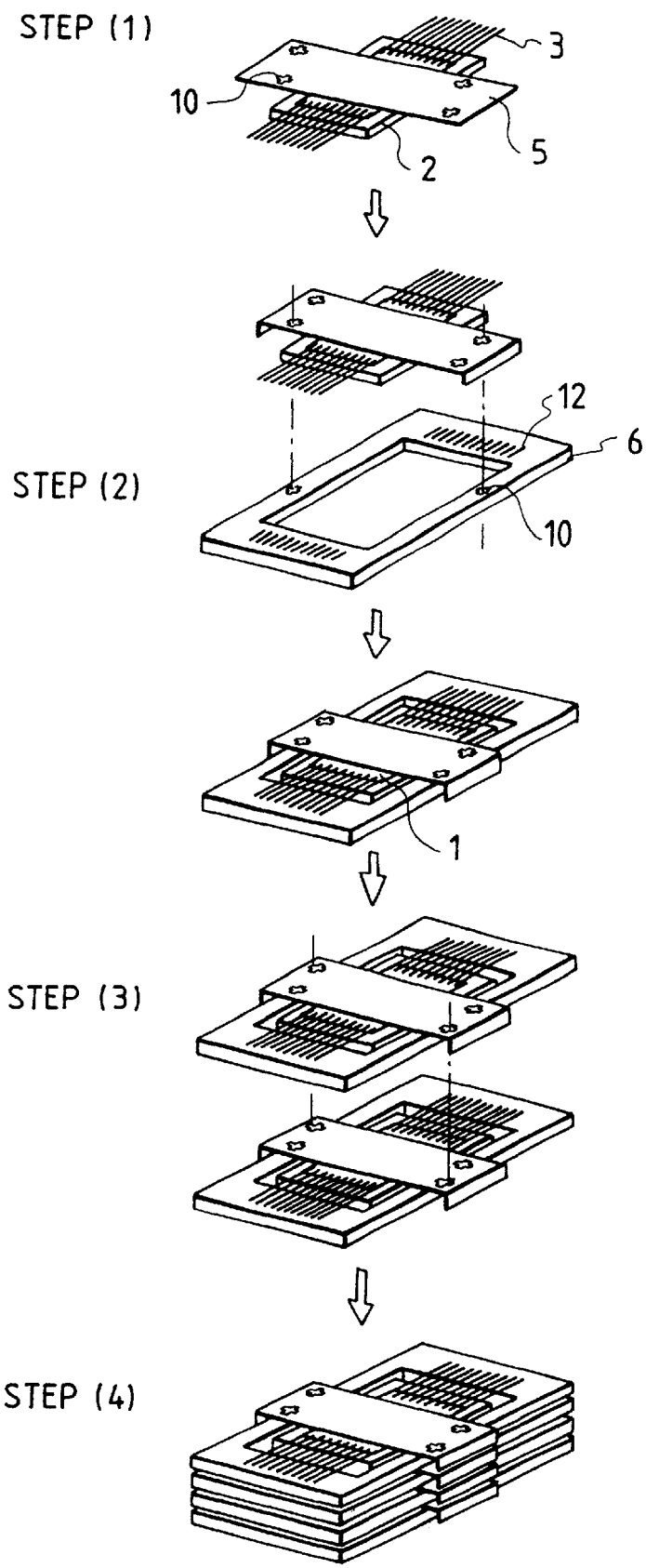
FIG. 17 illustrates an assembly for a four-layer chip semiconductor device lamination structure.
Figure 18:
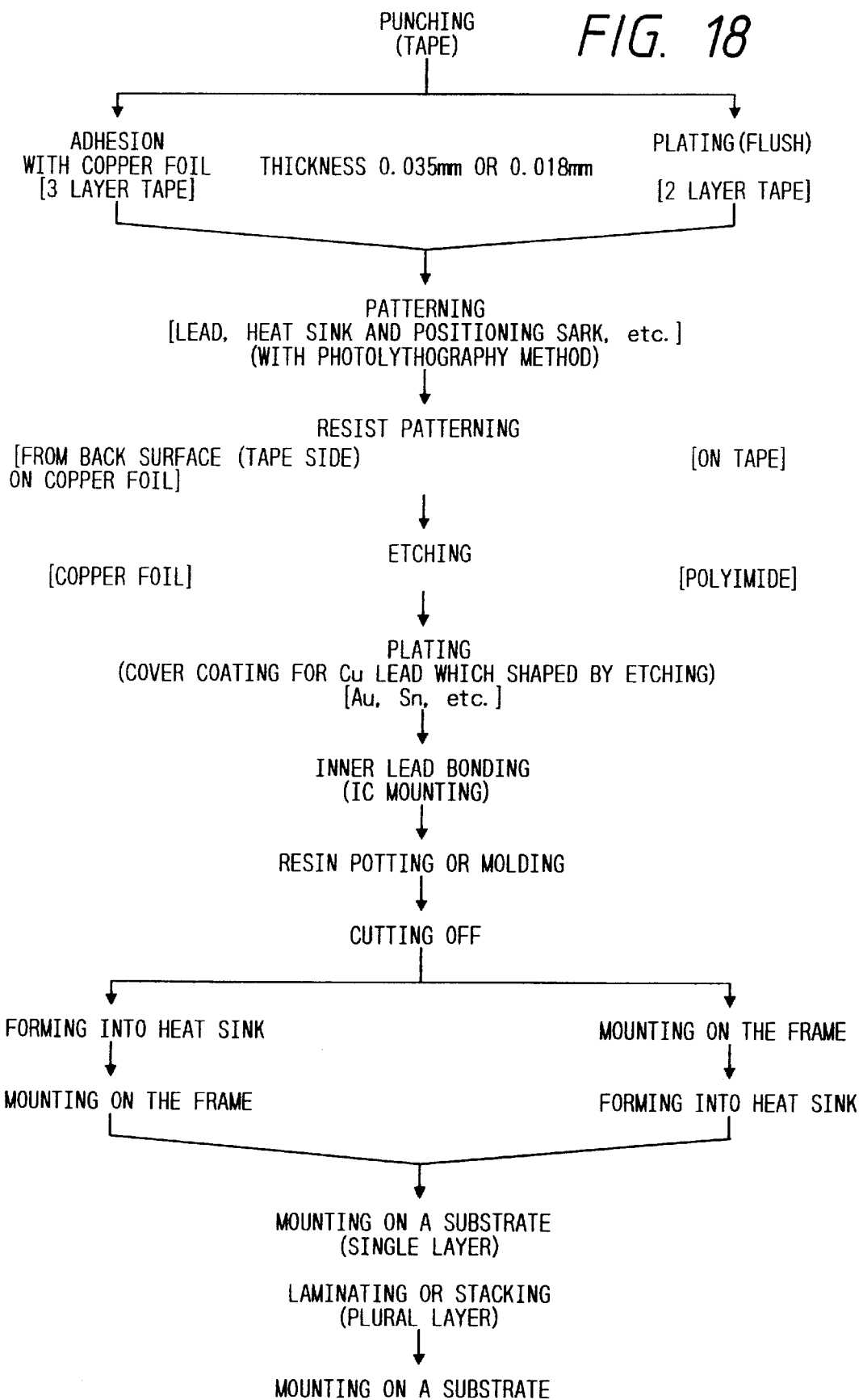
FIG. 18 is a flowchart of the formation of the heat sink and assembly thereof in a single or multiple layer structure.

FIG. 17 shows perspective views of the steps of the manufacturing process including of a TAB type semiconductor chip carrier with heat sink (step 1), a constituent unit of a cooling structure (step 2), a four-layer laminating process (step 3), and an entire cooling structure (step 4), respectively with FIG. 18 illustrating a flow chart more particularly setting forth such steps.

Leads 3 of the TAB type semiconductor chip with heat sink 5 are formed as described in the flow chart resulting in the arrangement illustrated in step 1 of FIG. 17. Patterns 12 on a connector 6 are registered with each other using positioning marks 10 on the heat sink 5 and positioning marks 10 on the connector so that the constituent unit of a cooling structure shown in step 2 of FIG. 17 is fabricated by electrical connection with the semiconductor chip 1 such as by solder reflow, for example. If only a single layer is to be utilized, then the single layer is mounted on a substrate as described in the flow chart of FIG. 18.

Figure 19:
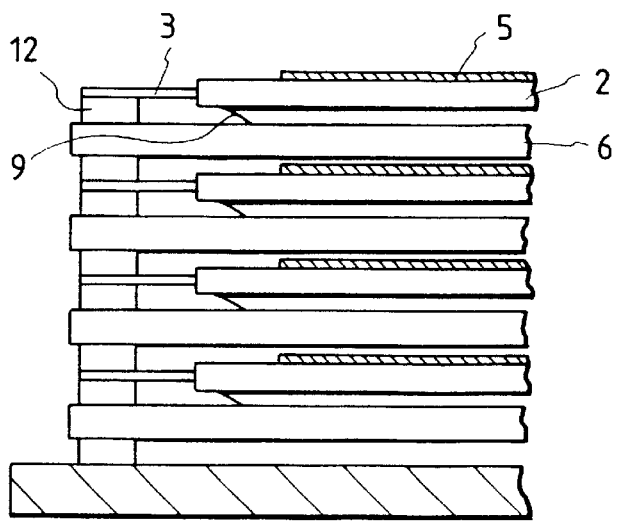
FIG. 19 illustrates a connector-heat sink positional relation.

Patterns 12 which are conductive in the up and down directions are formed on the upper and lower surfaces of the connector portion 6. In order that the heat sink can be taken out to the exterior without interference with the connector, the height of the patterns 12 projecting from the connector surface is set so that the connector-connector spacing is larger than the thickness of the heat sink 5 which is almost equal to the thickness (about 0.035 mm) of the leads 3 as shown in FIG. 19. Further, the patterns 12 on the lower surface of an overlying connector and the leads on an underlying layer are registered with each other and laminated together, using the positioning marks 10 for lamination provided on the heat sink 5 of the TAB type semiconductor chip. At this time, all of the four layers are temporarily bonded together by bonding between the heat sink 5 and the lower surface of the connector 6 of adjacent lower and upper layers, respectively, as shown in step 3 of FIG. 17. Thereafter, the constituent, laminated multi-chip semiconductor devices which are in the temporarily bonded state are electrically connected together by soldering as shown in step 4 of FIG. 17 and then mounted on a substrate. Thus, with respect to the laminated multi-chip semiconductor device using connectors 6 and TAB type semiconductor chips, the heat sink fabricating process can be adopted without greatly changing the laminating process in comparison with the laminating process carried out in the absence of a heat sink.

For example, by attaching radiations fins to the heat sink 5 using silver paste, for example, the surface area of the heat radiating portion can be increased and hence it is possible to further enhance the efficiency. In this case, there may be used an adhesive of high thermal conductivity such as, for example, a crystalline filler-contained epoxy resin (thermal conductivity: about 2 W/mK).

Figure 20:
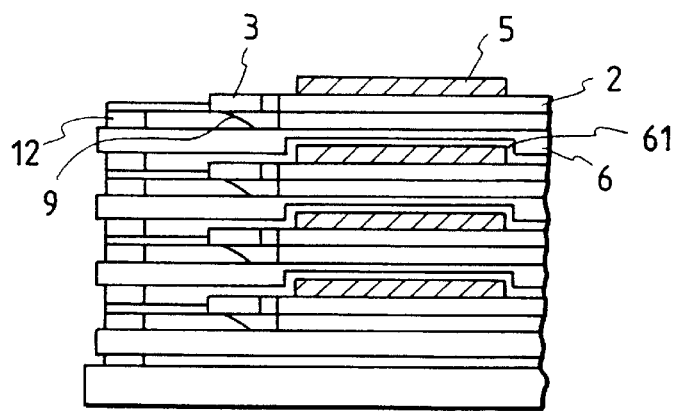
FIG. 20 illustrates a structure for avoiding heat sink-connector interference attained by processing the connector to include a groove therein.

With a view to preventing the interference between the heat sink 5 and the connector 6, the portion of the connector 6 which comes into abutment with the heat sink 5 may be formed with an interference preventing groove 61 as shown in FIG. 20 instead of adjusting the projecting height of the patterns from the connector surface.

Figure 21:
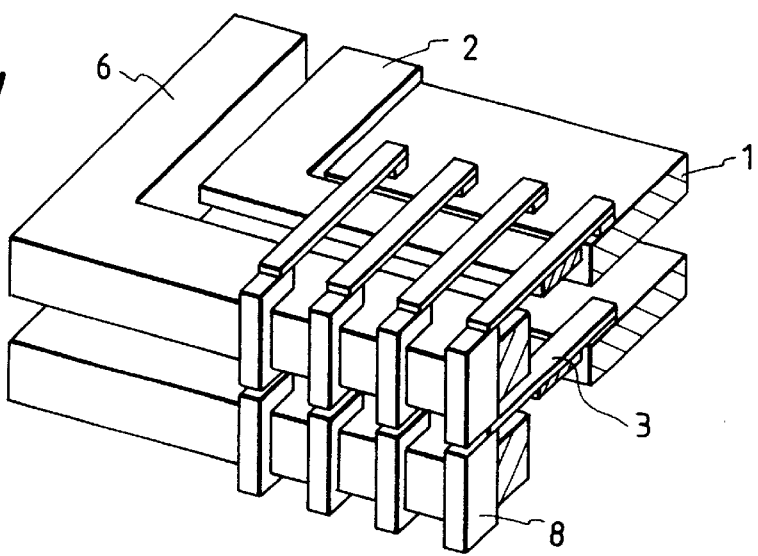
FIG. 21 illustrates a corner portion of a two-layer laminate structure including electrical conducting portions as a substitute for through holes.
Figure 22:
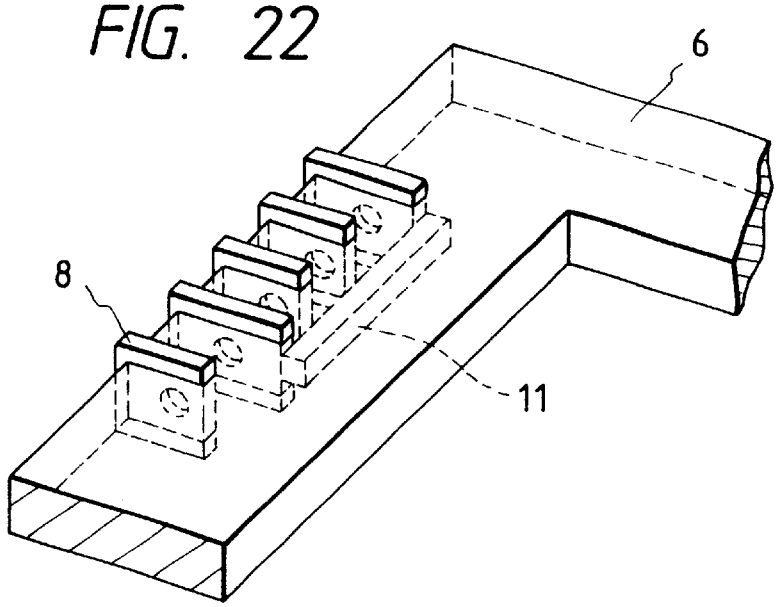
FIG. 22 is a perspective view of an electrical conducting portion as a substitute for a through hole.
Figure 23:
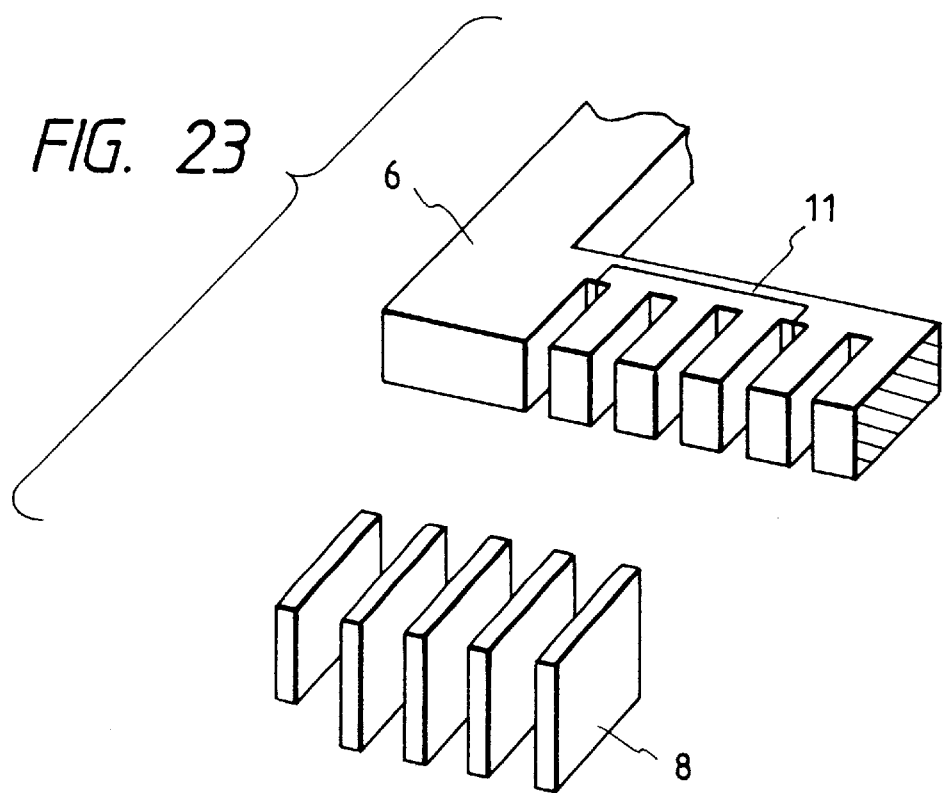
FIG. 23 illustrates an electrical conducting portion as a substitute for a through hole formed by a method different from that adopted in FIG. 22.

FIG. 21 is a sectional perspective view of a quarter portion of a two-layer laminate in which each TAB type semiconductor chip is electrically connected to a connector 6, the connector 6 having incorporated therein electrical conducting parts 8 as a substitute for a through hole and serving also essentially as a radiating fin for cooling. The electrical conducting parts 8 serve as a substitute for copper-plated through holes and patterns. FIG. 22 is a perspective view of a portion where the electrical conducting parts 8 are incorporated in the connector 6. FIG. 23 shows in what flow the electrical conducting parts 8 are incorporated in the connector 6, using a method different from that used in FIG. 22.

The electrical conducting parts 8 are held in predetermined positions by means of a jig. Then, a polyimide resin or a BT resin having heat resistance higher than the chip working temperature and also higher than the electrical connection process using solder is poured therein to form a connector 6. In this case, the electrical conducting parts 8 are each formed with a through hole as in FIG. 22 to ensure fixing. Even without using such resin, there may be adopted such a method as illustrated in FIG. 23 wherein cutouts are formed in the connector 6 beforehand in conformity with the electrical conducting parts 8 and thereafter the parts 8 are fitted in those cutouts. Such construction enables an improved heat radiation path during the operation of semiconductor chips as intermediate layers sandwiched in between other layers of semiconductor chips.

In the conventional method of electrically connecting semiconductor chip layers using through holes, there are two heat radiation paths. One heat radiation path conducts heat from one chip layer to another chip layer through an air layer present between both chips, while in the other heat radiation path, heat is transmitted from one semiconductor chip layer to another chip layer through leads 3 and a through hole. In comparison with the former heat radiation path, the metal of the through hole portion in the latter heat radiation path contributes more greatly to the conduction of heat. Therefore, the heat conduction is improved by using electrical conducting parts 8 formed of a metal of good thermal conductivity (about 370 W/mK) such as copper, and the radiation of heat to the substrate is thereby increased. Further, since the portion of the electrical conducting parts 8 projecting to the exterior from the connector 6 functions as fins, the radiation of heat to the atmosphere is promoted and so it is possible to suppress the rise in temperature of connections.

In the laminated multi-chip semiconductor device it is necessary to provide a circuit called a chip select 11 (FIGS. 23–25) for designating which chip layer is to be operated. Although there are used TAB tapes with leads for a switching operation in the same shape and kind, that is, in the same positions throughout the four layers, the chips of the four layers are to be operated selectively. To this end, the aforementioned circuit is used to draw out the leads for enabling a switching operation of the chip layers, each independently to separate electrical conducting parts 8 through wiring in the frame portion.

Figure 26A:
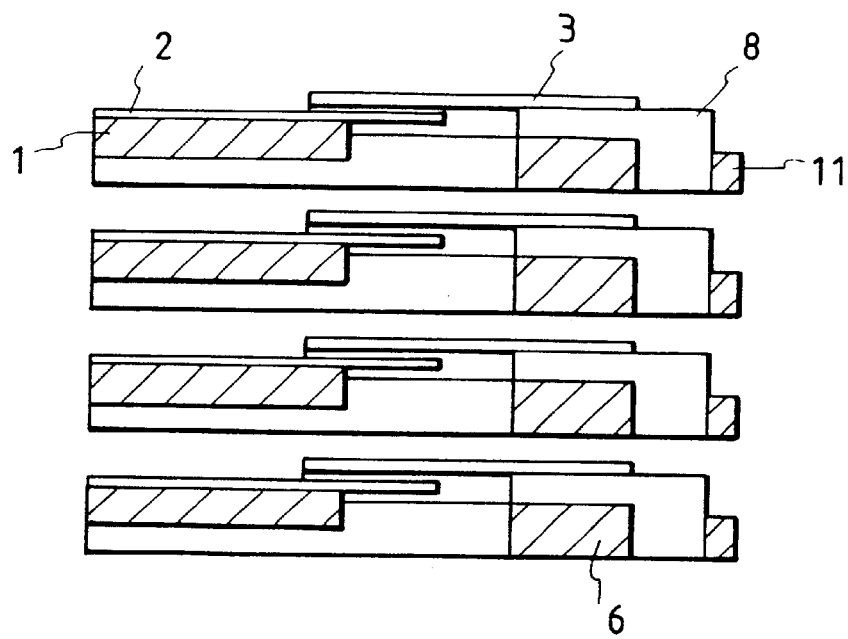
FIG. 26(a) is a sectional view of four-layers of electrical conducting portions on a connected side of leads drawn out by a chip select portion and enabling a switching action.
Figure 26B:
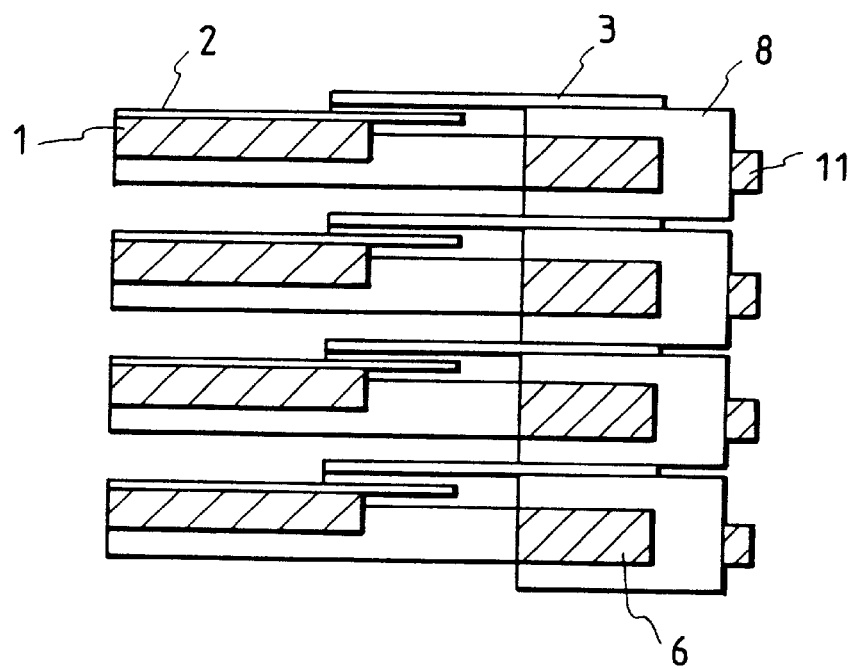
FIG. 26(b) illustrates electrical conducting portions with chip select portions connected thereto and reaching the bottom layer separately system by system.
Figure 27:
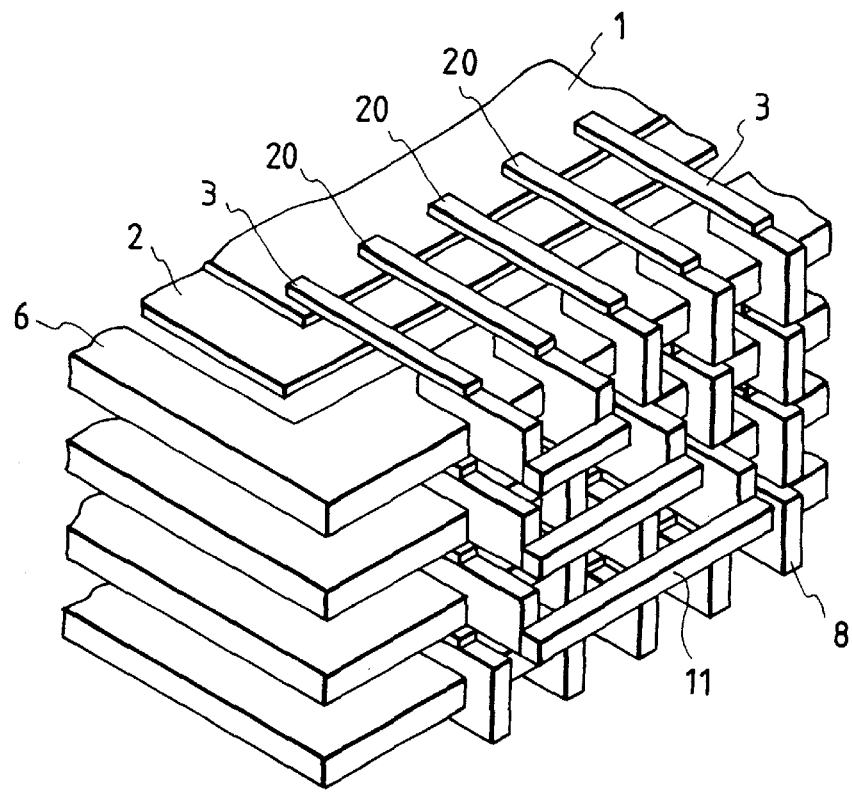
FIG. 27 is a perspective view of chip select portions provided externally for respective layers.
Figure 28:
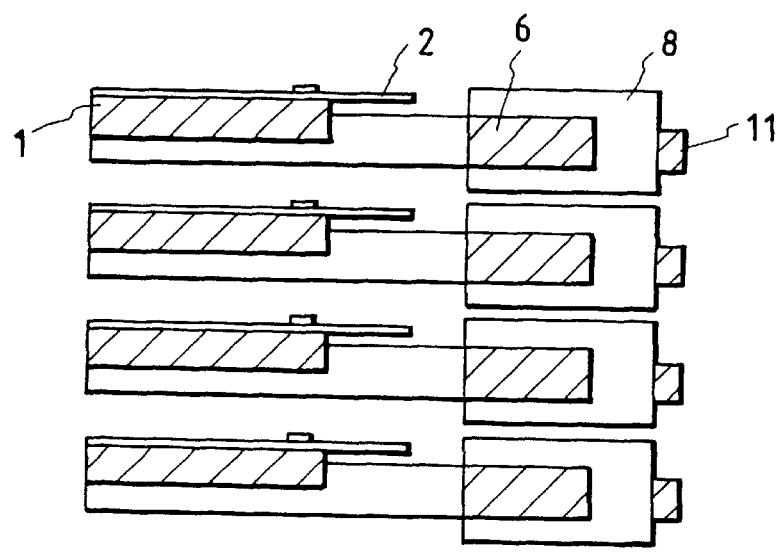
FIG. 28 is a sectional view of electrical conducting portions corresponding to FIG. 26(b) when dummy leads are not used.

The electrical conducting portion of each layer with the chip select 11 attached thereto is not in contact with the electrical conducting portions of the overlying and underlying layers, as shown in FIG. 26(a). The interference with right and left electrical conducting portions is prevented by changing the protrusion as will be shown later, and leads are drawn out and connected to electrical conducting portions in different positions of each layer by the chip select 11, assuming a state of reaching the bottom layer through the electrical connections, as shown in FIG. 26(b). Each layer can be selectively operated by the selection of electrical conducting portions located in four positions which are independent system by system. In this case, on the drawn-out side by the chip select, the leads which are connected from the chip layers to the electrical conducting portions connected to all of the four layers are designated dummy leads 20 (FIG. 27) not concerned with the operation of each layer. By the connection of the dummy leads 20, the electrical conducting portions of the chip layers are connected without having a gap corresponding to the thickness of each lead. Without such dummy leads, the gap is formed as in FIG. 28. Further, as in the perspective view of FIG. 27 showing a chip select portion mounted externally, the electrical conducting portion with leads for enabling a switching operation of the bottom layer is mounted on the substrate in that position without chip select, so that the chip select portions 11 and the dummy leads 20 are required to be present in three layers for the distribution of four layers.

Figure 24:
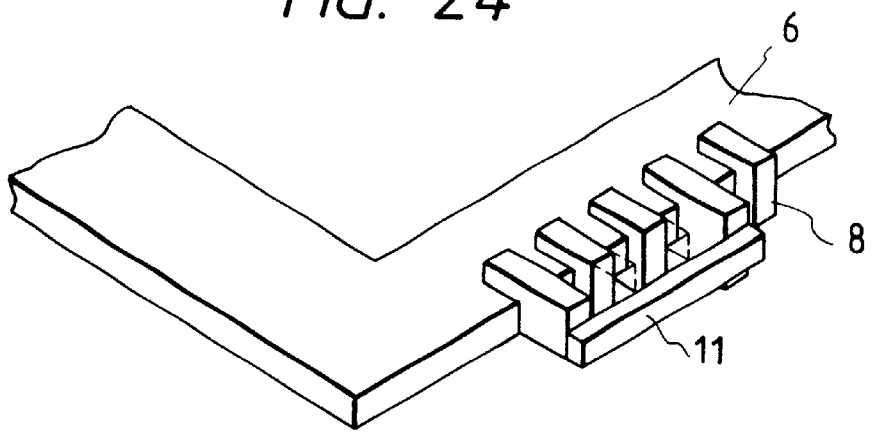
FIG. 24 illustrates a structure wherein a chip select portion has been formed externally after the formation of a connector.
Figure 25:
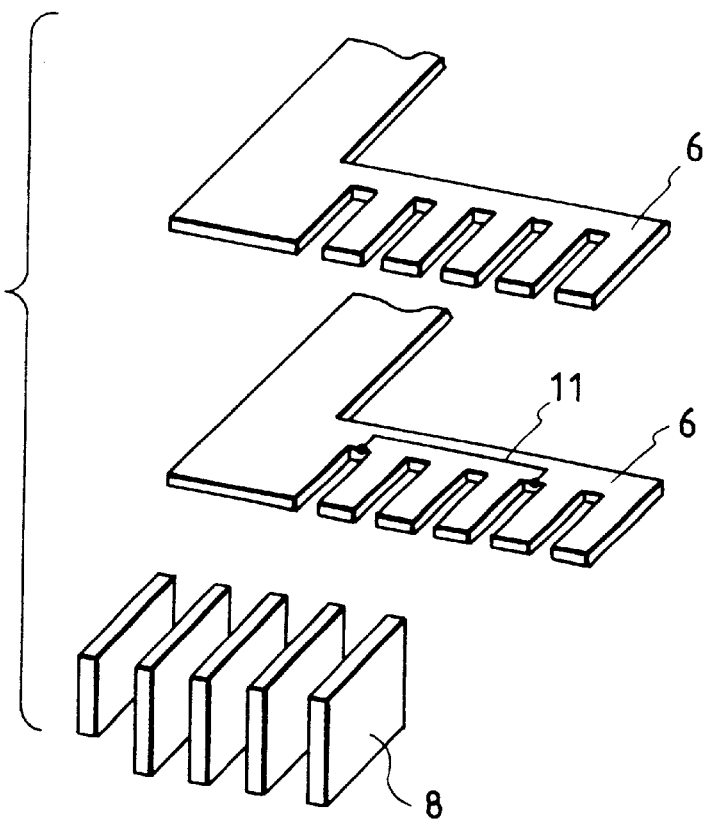
FIG. 25 illustrates a structure wherein a chip select portion using plated wiring is incorporated in the interior of a connector having a two-layer structure.

In this construction, each chip select 11 can be formed in the following manner for example. According to one method, as shown in FIG. 22, the chip select 11 is attached to the electrical conducting portion in advance, followed by casting into the connector 6. In this case, the electrical conducting portion utilized as the chip select 11 is prevented from interference with other unrelated electrical conducting portions by changing its length and height. There also may be adopted a method wherein the chip select portion is later connected to the exterior, as shown in FIG. 24. As shown in FIG. 23, the technique used in solid wiring for MCB (Molded Circuit Board) may be applied to the constituent member of the connector portion, and plated wiring is used as chip select 11. According to another method, as shown in FIG. 25, there is used a connector of a two-layered laminate structure, and a chip select 11 formed using plated wiring is inserted between the layers. This structure is advantageous in that a poor connection such as short-circuiting can be prevented by a soldered electrical connection formed in the lead connecting process.

According to the present invention, the semiconductor chips of a laminated multi-chip semiconductor device, especially the semiconductor chips of intermediate layers, are cooled positively, whereby the temperature of the semiconductor chips in operation and hence the temperature of the entire device can be kept low. Moreover, since the influence of heat on semiconductor chips with each other can be reduced, the invention is effective in preventing the deterioration of performance caused by heating of semiconductor chips and also preventing malfunction. Further, when the device is used over a long period, the thermal fatigue can be decreased because the rise in temperature of electrical connections is suppressed, whereby the reliability of the connections is improved.

While the present invention has been described in terms of its preferred embodiments, it should be understood that numerous modifications may be made thereto without departing from the spirit and scope of the invention as defined in the appended claims. It is intended that all such modifications fall within the scope of the appended claims.

We claim:

1. A method for forming a film carrier tape for a semiconductor device comprising the steps of superposing a metallic layer on a carrier member and etching the metallic layer so as to form metallic leads and a heat sink separate from the metallic leads for the semiconductor device.

2. A method according to claim 1, wherein the step of etching includes forming the metallic leads so as to extend in a first direction and forming the heat sink so as to extend in a second direction transverse to the first direction.

3. A method according to claim 2, further comprising the steps of coupling the metallic leads to at least one of a semiconductor chip and a connecter therefor, and coupling the heat sink to the semiconductor device for enabling heat radiation therefrom.

4. A method according to claim 3, further comprising the step of mounting the semiconductor chip on a substrate.

5. A method of forming a laminated multi-chip semiconductor device comprising a step of stacking a plurality of chip semiconductor devices in multiple layers on a substrate, wherein said chip semiconductor devices are formed by the steps of:
   providing a film carrier tape with leads;
   electrically connecting a semiconductor chip to the leads of the film carrier tape;
   mounting a heat sink separate from the leads electrically connected to the semiconductor chip to a surface of the semiconductor chip; and
   providing a connector for the mounting of the heat sink and electrically connecting the connector to the leads of the film carrier tape.

6. A method according to claim 5, wherein the film carrier tape includes a carrier member and a metallic layer superimposed thereon, and further comprising the step of etching the metallic layer so as to form the leads and the heat sink for the semiconductor chip.

7. A method according to claim 6, wherein the step of etching includes forming the metallic leads so as to extend in a first direction and the heat sink so as to extend in a second direction transverse to the first direction.

8. A method according to claim 5, further comprising the steps of providing at least one first positioning mark on the heat sink, and providing at least one second positioning mark on the connector corresponding to the first positioning mark, and utilizing the first and second positioning marks for alignment.

9. A method according to claim 5, further comprising the step of connecting the heat sink to the substrate.

10. A method according to claim 9, wherein the substrate is a metal core substrate.

11. A method according to claim 5, further comprising the steps of forming a heat conducting pattern on the substrate, and connecting the heat sink to the substrate through the heat conducting pattern.

12. A method according to claim 5, further comprising the step of providing an opening in the heat sink at a position overlaying a portion of the semiconductor chip.

13. A method according to claim 5, further comprising the step of providing radiation fins at an outer exposed portion of the heat sink.

14. A method according to claim 5, further comprising the step of forming the connector with a groove portion.

15. A method according to claim 5, further comprising the step of providing a heat insulator at least between adjacent ones of the plurality of semiconductor chip devices for reducing heat transfer therebetween.

16. A method according to claim 15, wherein the heat insulator is provided at least at one portion of the heat sink.

17. A method according to claim 5, further comprising the steps of electrically connecting electrical and heat conducting parts to the leads of the film carrier tape so as to extend outwardly therefrom for enabling heat radiation therefrom.

18. A method of forming a laminated multi-chip semiconductor device comprising the step of stacking a plurality of chip semiconductor devices in multiple layers on a substrate, wherein each of said plurality of chip semiconductor devices is formed by the steps of:
   providing a film carrier tape with leads; and
   electrically connecting a semiconductor chip to the leads of the film carrier tape;
   wherein at least three layers are provided and for at least an intermediate layer of the at least three layers of the chip semiconductor devices further including the step of providing a heat sink separate from the leads electrically connected to the semiconductor chip at a surface of the semiconductor chip for enabling heat radiation therefrom.

19. A method according to claim 18, wherein at least the film carrier tape of the intermediate layer of the chip semiconductor devices is provided with a carrier member and a metallic layer superposed thereon, and further comprising the step of etching the metallic layer so as to form the leads and the heat sink for the semiconductor chip.

20. A method according to claim 19, wherein the step of etching includes forming the metallic leads so as to extend in a first direction and the heat sink so as to extend in a second direction transverse to the first direction.

21. A method according to claim 18, wherein each layer of the multiple layers of the chip semiconductor devices is provided with a heat sink at a surface of the semiconductor chip.

22. A method according to claim 21, wherein the film carrier tape of each of the semiconductor chip devices includes a carrier member and a metallic layer superposed thereon and further comprising the step of etching a metallic layer so as to form the leads and the heat sink for the semiconductor chip.

23. A method according to claim 22, wherein the step of etching includes forming a metallic lead so as to extend in a first direction and the heat sink so as to extend in a second direction transverse to the first direction.

24. A method according to claim 23, further comprising the step of providing a connector for mounting of the heat sink of the semiconductor chip and electrically connecting the connector to the leads of the film carrier tape.

* * * * *